United States Patent
Ko (10) Patent No.: US 9,350,355 B2
(45) Date of Patent: May 24, 2016

(54) SEMICONDUCTOR APPARATUS

(71) Applicant: SK hynix Inc., Icheon-si Gyeonggi-do (KR)

(72) Inventor: Jae Bum Ko, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/564,577

(22) Filed: Dec. 9, 2014

(65) Prior Publication Data

US 2016/0043723 A1    Feb. 11, 2016

(30) Foreign Application Priority Data

Aug. 8, 2014    (KR) .................. 10-2014-0102531

(51) Int. Cl.
*H03K 19/173* (2006.01)
*H03K 19/20* (2006.01)

(52) U.S. Cl.
CPC ............ *H03K 19/1733* (2013.01); *H03K 19/20* (2013.01)

(58) Field of Classification Search
CPC ............... H03K 19/1733; H03K 19/20–19/21
USPC ................................................ 326/37–41, 47
See application file for complete search history.

(56) References Cited

U.S. PATENT DOCUMENTS

| 4,163,211 A * | 7/1979 | Miura ................. H03K 19/1733 340/146.2 |
| 7,193,432 B1 * | 3/2007 | Schmit ............. H03K 19/17756 257/774 |
| 2012/0140870 A1 * | 6/2012 | Lee ........................ H03K 21/406 377/39 |

FOREIGN PATENT DOCUMENTS

| KR | 1020070035209 A | 3/2007 |
| KR | 1020140042236 A | 4/2014 |

* cited by examiner

*Primary Examiner* — Jason M Crawford
(74) *Attorney, Agent, or Firm* — William Park & Associates Ltd.

(57) ABSTRACT

A semiconductor apparatus may include an operation signal input selection block configured to output one of either a first operation signal or a second operation signal, as a select signal, in response to an operation select signal. The semiconductor apparatus may include a target code selection block configured to output one of either a first target code or a second target code, as a select code, in response to the operation select signal. The semiconductor apparatus may include an enable signal generation block configured to generate an enable signal when a time corresponding to the select code passes, in response to the select signal. The semiconductor apparatus may include an operation signal output selection block configured to output the enable signal, as one of either a third operation signal or a fourth operation signal, in response to the operation select signal.

17 Claims, 5 Drawing Sheets

SEMICONDUCTOR APPARATUS

CROSS-REFERENCES TO RELATED APPLICATION

The present application claims priority under 35 U.S.C. §119(a) to Korean application number 10-2014-0102531, filed on Aug. 8, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus may be configured to perform a certain operation. The semiconductor apparatus may be configured to perform another operation when a preset time passes after the certain operation. For example, when a preset time passes after an A operation, a semiconductor apparatus may be configured to perform a B operation.

A semiconductor apparatus may employ a control circuit for controlling the operation timings of the A operation and the B operation. In an asynchronous semiconductor apparatus, an RC delay circuit, an inverter chain, or the like may be used to control operation timings, In a synchronous semiconductor apparatus, a circuit for counting cycles of a clock and measuring a preset time may be used to control operation timings.

As semiconductor apparatuses are developed, the number of circuits used for performing other operations in response to the passing of preset times after certain operations has increased. To accommodate the increased number of circuits used for measuring preset times, the area used by the semiconductor apparatuses has increased.

SUMMARY

In an embodiment, a semiconductor apparatus may include an operation signal input selection block configured to output one of either a first operation signal or a second operation signal, as a select signal, in response to an operation select signal. The semiconductor apparatus may also include a target code selection block configured to output one of either a first target code or a second target code, as a select code, in response to the operation select signal. The semiconductor apparatus may include an enable signal generation block configured to generate an enable signal when a time corresponding to the select code passes, in response to the select signal. The semiconductor apparatus may also include an operation signal output selection block configured to output the enable signal, as one of either a third operation signal or a fourth operation signal, in response to the operation select signal.

In an embodiment, a semiconductor apparatus may include an enable signal generation block configured to enable an enable signal when a preset time passes after a select signal is enabled. The semiconductor apparatus may include a target code selection block configured to determine the preset time in response to an operation select signal, and transfer the preset time to the enable signal generation block.

DETAILED DESCRIPTION

Hereinafter, a semiconductor apparatus will be described below with reference to the accompanying drawings through various examples of embodiments.

Figure 1:
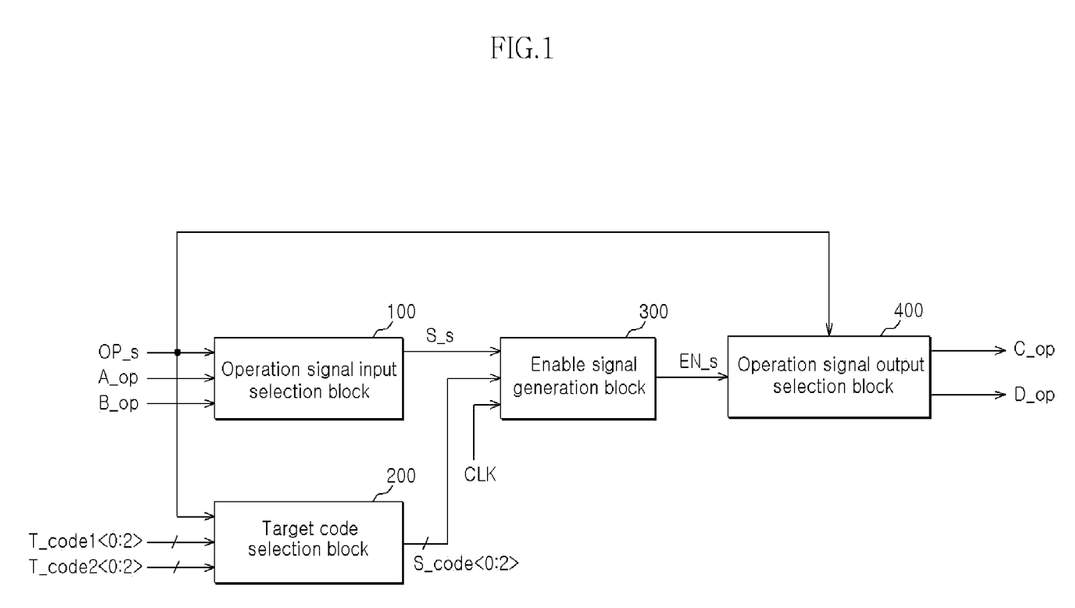
FIG. 1 is a configuration diagram illustrating a representation of an example of a semiconductor apparatus in accordance with an embodiment.

Referring to FIG. 1, a semiconductor apparatus in accordance with an embodiment may include an operation signal input selection block 100, a target code selection block 200, and an enable signal generation block 300. The semiconductor apparatus may include an operation signal output selection block 400.

The operation signal input selection block 100 may output one of either a first operation signal A_op or a second operation signal B_op, as a select signal S_s, in response to an operation select signal OP_s. For example, the operation signal input selection block 100 may output the first operation signal A_op as the select signal S_s when the operation select signal OP_s is enabled. For example, the operation signal input selection block 100 may output the second operation signal B_op as the select signal S_s when the operation select signal OP_s is disabled.

The target code selection block 200 may output one of either a first target code T_code1<0:2> or a second target code T_code2<0:2>, as a select code S_code<0:2>, in response to the operation select signal OP_s. For example, the target code selection block 200 may output the first target code T_code1<0:2> as the select code S_code<0:2> when the operation select signal OP_s is enabled. For example, the target code selection block 200 may output the second target code T_code2<0:2> as the select code S_code<0:2> when the operation select signal OP_s is disabled.

The enable signal generation block 300 may enable an enable signal EN_s when a time corresponding to the code value of the select code S_code<0:2> passes, in response to the select signal S_s. For example, if the select signal S_s is enabled, the enable signal generation block 300 enables the enable signal EN_s when a preset number of cycles of a clock CLK, corresponding to the code value of the select code S_code<0:2>, passes or occurs.

The operation signal output selection block 400 may output the enable signal EN_s, as one of either a third operation signal C_op or a fourth operation signal D_op, in response to the operation select signal OP_s. For example, the operation signal output selection block 400 may output the enable signal EN_s, as the third operation signal C_op, when the operation select signal OP_s is enabled. For example, the operation signal output selection block 400 may output the enable signal EN_s, as the fourth operation signal D_op, when the operation select signal OP_s is disabled.

Figure 2:
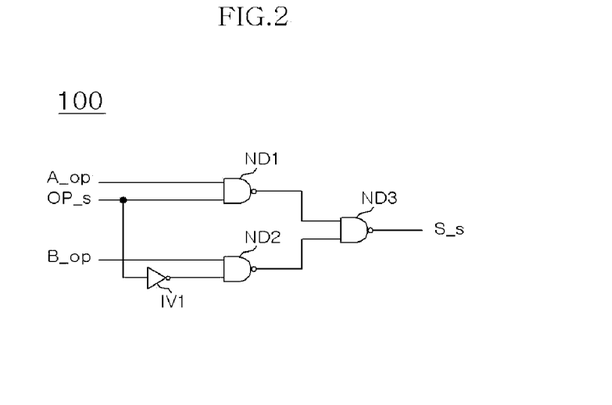
FIG. 2 is a configuration diagram illustrating a representation of an example of the operation signal input selection block illustrated in FIG. 1.

Referring to FIG. 2, the operation signal input selection block 100 may include first to third NAND gates ND1, ND2 and ND3, and a first inverter IV1. The first NAND gate ND1 may be inputted with the first operation signal A_op and the operation select signal OP_s. The first inverter IV1 may be inputted with the operation select signal OP_s. The second NAND gate ND2 may be inputted with the second operation signal B_op and the output signal of the first inverter IV1. The third NAND gate ND3 may be inputted with the output signals of the first and second NAND gates ND1 and ND2, and may output the select signal S_s.

The operation signal input selection block 100 configured in this way may output the first operation signal A_op, as the select signal S_s, when the operation select signal OP_s which is enabled to a high level is received. The operation signal input selection block 100 may output the second operation signal B_op, as the select signal S_s, when the operation select signal OP_s which is disabled to a low level is received.

Figure 3:
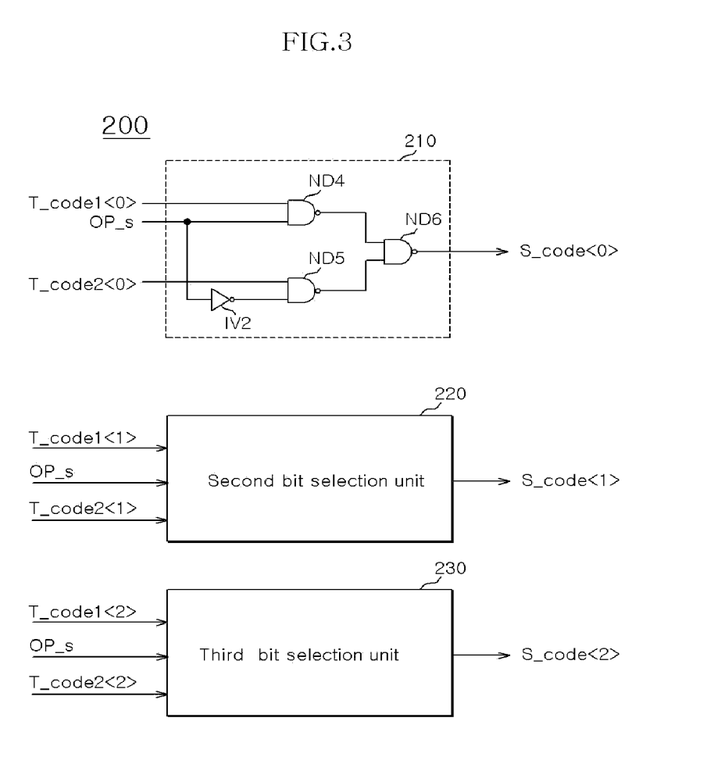
FIG. 3 is a configuration diagram illustrating a representation of an example of the target code selection block illustrated in FIG. 1.

Referring to FIG. 3, the target code selection block 200 may include first to third bit selection units 210, 220 and 230.

The first bit selection unit 210 may output one of either the first bit T_code1<0> of the first target code T_code1<0:2> or the first bit T_code2<0> of the second target code T_code2<0:2>, as the first bit S_code<0> of the select code S_code<0:2>, in response to the operation select signal OP_s. For example, the first bit selection unit 210 may output the first bit T_code1<0> of the first target code T_code1<0:2>, as the first bit S_code<0> of the select code S_code<0:2>, when the operation select signal OP_s is enabled. For example, the first bit selection unit 210 may output the first bit T_code2<0> of the second target code T_code2<0:2>, as the first bit S_code<0> of the select code S_code<0:2>, when the operation select signal OP_s is disabled.

The first bit selection unit 210 may include fourth to sixth NAND gates ND4, ND5 and ND6, and a second inverter IV2. The fourth NAND gate ND4 may receive the first bit T_code1<0> of the first target code T_code1<0:2> and the operation select signal OP_s. The second inverter IV2 may receive the operation select signal OP_s. The fifth NAND gate ND5 may receive the first bit T_code2<0> of the second target code T_code2<0:2> and the output signal of the second inverter IV2. The sixth NAND gate ND6 may receive the output signals of the fourth and fifth NAND gates ND4 and ND5, and may output the first bit S_code<0> of the select code S_code<0:2>.

The second bit selection unit 220 may output one of either the second bit T_code1<1> of the first target code T_code1<0:2> or the second bit T_code2<1> of the second target code T_code2<0:2>, as the second bit S_code<1> of the select code S_code<0:2>, in response to the operation select signal OP_s. For example, the second bit selection unit 220 may output the second bit T_code1<1> of the first target code T_code1<0:2>, as the second bit S_code<1> of the select code S_code<0:2>, when the operation select signal OP_s is enabled. For example, the second bit selection unit 220 may output the second bit T_code2<1> of the second target code T_code2<0:2>, as the second bit S_code<1> of the select code S_code<0:2>, when the operation select signal OP_s is disabled.

The third bit selection unit 230 may output one of either the third bit T_code1<2> of the first target code T_code1<0:2> or the third bit T_code2<2> of the second target code T_code2<0:2>, as the third bit S_code<2> of the select code S_code<0:2>, in response to the operation select signal OP_s. For example, the third bit selection unit 230 may output the third bit T_code1<2> of the first target code T_code1<0:2>, as the third bit S_code<2> of the select code S_code<0:2>, when the operation select signal OP_s is enabled. For example, the third bit selection unit 230 may output the third bit T_code2<2> of the second target code T_code2<0:2>, as the third bit S_code<2> of the select code S_code<0:2>, when the operation select signal OP_s is disabled.

Since the second and third bit selection units 220 and 230 are configured in substantially the same way as the first bit selection unit 210 except that the signals inputted thereto and the signals outputted therefrom are different, the description of the configuration of the first bit selection unit 210 will replace the descriptions of the configurations of the second and third bit selection units 220 and 230.

Figure 4:
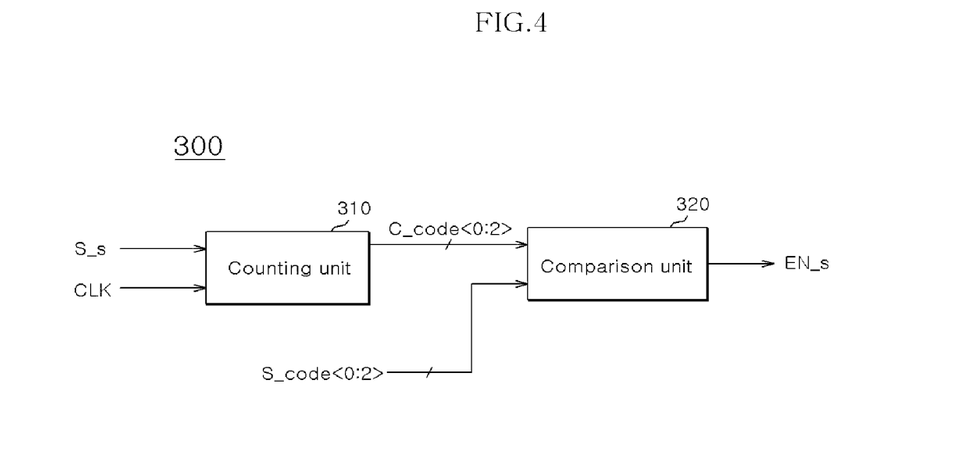
FIG. 4 is a configuration diagram illustrating a representation of an example of the enable signal generation block illustrated in FIG. 1.

Referring to FIG. 4, the enable signal generation block 300 may include a counting unit 310 and a comparison unit 320.

The counting unit 310 may change the code value of a counting code C_code<0:2> each time the clock CLK transitions to a specified level, when the select signal S_s is enabled. The counting unit 310 may initialize the counting code C_code<0:2> when the select signal S_s is disabled. For example, the counting unit 310 increases the code value of the counting code C_code<0:2> each time the clock CLK transitions to a high level, when the select signal S_s is enabled. For example, the counting unit 310 initializes the code value of the counting code C_code<0:2> when the select signal S_s is disabled.

The comparison unit 320 may compare the counting code C_code<0:2> and the select code S_code<0:2>, and may generate the enable signal EN_s. For example, the comparison unit 320 may enable the enable signal EN_s when the code value of the counting code C_code<0:2> and the code value of the select code S_code<0:2> are the same.

Figure 5:
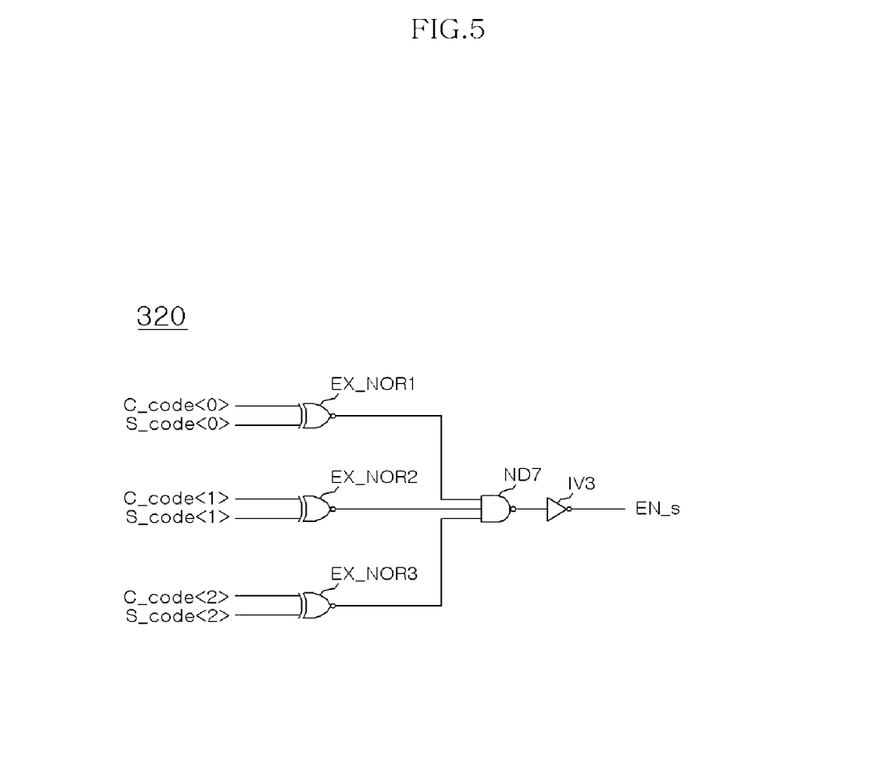
FIG. 5 is a configuration diagram illustrating a representation of an example of the comparison unit illustrated in FIG. 4.

Referring to FIG. 5, the comparison unit 320 may include first to third exclusive NOR gates EX_NOR1, EX_NOR2 and EX_NOR3, a seventh NAND gate ND7, and a third inverter IV3. The first exclusive NOR gate EX_NOR1 may receive the first bit C_code<0> of the counting code C_code<0:2> and the first bit S_code<0> of the select code S_code<0:2>. The second exclusive NOR gate EX_NOR2 may receive the second bit C_code<1> of the counting code C_code<0:2> and the second bit S_code<1> of the select code S_code<0:2>. The third exclusive NOR gate EX_NOR3 may receive the third bit C_code<2> of the counting code C_code<0:2> and the third bit S_code<2> of the select code S_code<0:2>. The seventh NAND gate ND7 may receive the output signals of the first to third exclusive NOR gates EX_NOR1, EX_NOR2 and EX_NOR3. The third inverter IV3 may receive the output signal of the seventh NAND gate ND7, and may output the enable signal EN_s.

Figure 6:
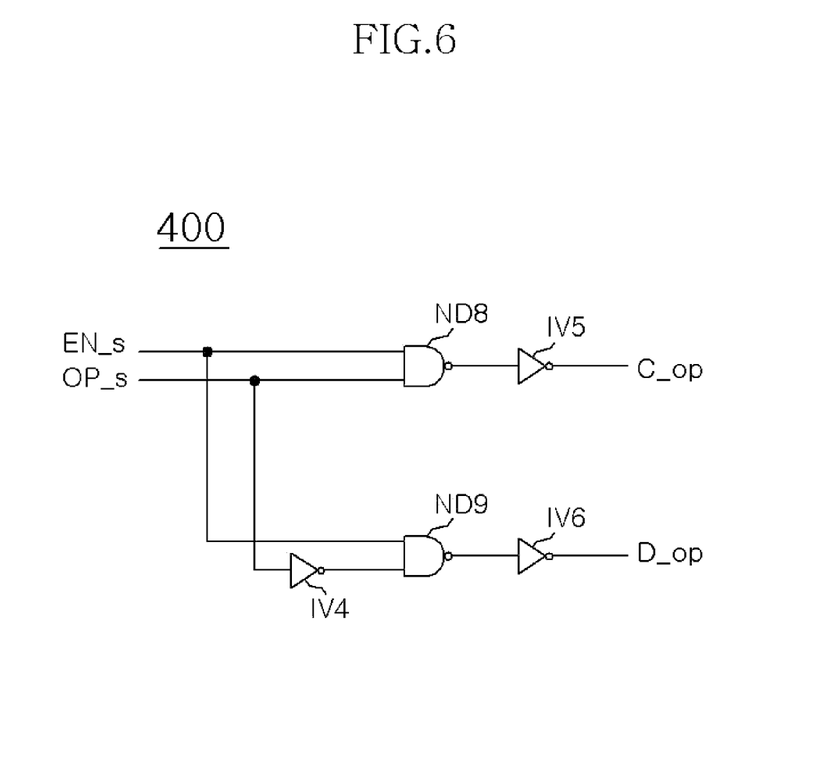
FIG. 6 is a configuration diagram illustrating a representation of an example of the operation signal output selection block illustrated in FIG. 1.

Referring to FIG. 6, the operation signal output selection block 400 may include fourth to sixth inverters IV4, IV5 and IV6. The operation signal output selection block 400 may include eighth and ninth NAND gates ND8 and ND9. The eighth NAND gate ND8 may receive the enable signal EN_s and the operation select signal OP_s. The fourth inverter IV4 may receive the operation select signal OP_s. The ninth NAND gate ND9 may receive the enable signal EN_s and the output signal of the fourth inverter IV4. The fifth inverter IV5 may receive the output signal of the eighth NAND gate ND8, and may output the third operation signal C_op. The sixth inverter IV6 may receive the output signal of the ninth NAND gate ND9, and may output the fourth operation signal D_op.

The semiconductor apparatus in accordance with the embodiments, configured as mentioned above, may operate as follows.

It may be assumed, for example, that the code value of the first target code T_code1<0:2> is (0,1,0), and the code value of the second target code T_code2<0:2> is, for example, (1,0,0).

If the first operation signal A_op is enabled in the state in which the operation select signal OP_s is enabled, the operation signal input selection block 100 enables the select signal S_s.

In the state in which the operation select signal OP_s is enabled, the target code selection block 200 outputs the first target code T_code1<0:2> as the select code S_code<0:2>.

The enable signal generation block 300 increases the code value of the counting code C_code<0:2> each time the clock CLK transitions to the specified level, when the select signal S_s is enabled. The enable signal generation block 300 enables the enable signal EN_s when the increased code value of the counting code C_code<0:2> becomes the same as the code value of the select code S_code<0:2>.

Since the operation select signal OP_s is in the enabled state, the operation signal output selection block 400 outputs the enable signal EN_s as the third operation signal C_op.

Further descriptions will be made below.

Since the operation select signal OP_s is in the enabled state, the operation signal input selection block 100 outputs the first operation signal A_op as the select signal S_s, and the target code selection block 200 outputs the first target code T_code1<0:2> as the select code S_code<0:2>. Since the code value of the first target code T_code1<0:2> is (0,1,0), the code value of the select code S_code<0:2> is also (0,1,0).

The operation of the enable signal generation block 300 will be described below with reference to FIG. 4.

The counting unit 310 initializes the counting code C_code<0:2> to (0,0,0) before the select signal S_s is enabled, that is, in the disabled state of the select signal S_s.

The counting unit 310 increases the counting code C_code<0:2> initialized to (0,0,0), each time the clock CLK transitions to the high level, when the select signal S_s is enabled.

The comparison unit 320 enables the enable signal EN_s when the increased code value of the counting code C_code<0:2> becomes the same as the code value of the select code S_code<0:2>. The code value of the select code S_code<0:2> is (0,1,0).

As a result, the enable signal generation block 300 enables the enable signal EN_s when the code value of the counting code C_code<0:2> which is increased from (0,0,0) after the select signal S_s is enabled becomes the same as the code value (0,1,0) of the select code S_code<0:2>. The counting unit 310 increases the code value of the counting code C_code<0:2> each time the clock CLK transitions to the high level. Therefore, the counting code C_code<0:2> which has the code value of (0,0,0) has the code value of (0,0,1) when the clock CLK first becomes the high level after the select signal S_s is enabled, and has the code value of (0,1,0) when the clock CLK second becomes the high level. If the code value of the counting code C_code<0:2> becomes (0,1,0), the enable signal EN_s is enabled.

Thus, enable signal generation block 300 may enable the enable signal EN_s when 2 cycles of the clock CLK pass after the select signal S_s is enabled.

The operation signal output selection block 400 outputs the enable signal EN_s as the third operation signal C_op since the operation select signal OP_s is in the enabled state.

In the semiconductor apparatus in accordance with an embodiment, in the examples where the code value of the first target code T_code1<0:2> is, for example, (0,1,0) and the operation select signal OP_s is enabled, the third operation signal C_op is enabled when 2 cycles of the clock CLK pass after the first operation signal A_op is enabled.

Furthermore, if the second operation signal B_op is enabled in the state in which the operation select signal OP_s is disabled, the operation signal input selection block 100 enables the select signal S_s.

In the state in which the operation select signal OP_s is disabled, the target code selection block 200 outputs the second target code T_code2<0:2> as the select code S_code<0:2>.

The enable signal generation block 300 increases the code value of the counting code C_code<0:2> each time the clock CLK transitions to the specified level, when the select signal S_s is enabled. The enable signal generation block 300 enables the enable signal EN_s when the increased code value of the counting code C_code<0:2> becomes the same as the code value of the select code S_code<0:2>.

Since the operation select signal OP_s is in the disabled state, the operation signal output selection block 400 outputs the enable signal EN_s as the fourth operation signal D_op.

Further descriptions will be made below.

Since the operation select signal OP_s is in the disabled state, the operation signal input selection block 100 outputs the second operation signal B_op as the select signal S_s, and the target code selection block 200 outputs the second target code T_code2<0:2> as the select code S_code<0:2>. Since the code value of the second target code T_code2<0:2> is (1,0,0), the code value of the select code S_code<0:2> is also (1,0,0).

The operation of the enable signal generation block 300 will be described below with reference to FIG. 4.

The counting unit 310 may initialize the counting code C_code<0:2> to (0,0,0) before the select signal S_s is enabled, that is, in the disabled state of the select signal S_s.

The counting unit 310 may increase the counting code C_code<0:2> initialized to (0,0,0), each time the clock CLK transitions to the high level, when the select signal S_s is enabled.

The comparison unit 320 may enable the enable signal EN_s when the increased code value of the counting code C_code<0:2> becomes the same as the code value of the select code S_code<0:2>. The code value of the select code S_code<0:2> is (1,0,0).

As a result, the enable signal generation block 300 enables the enable signal EN_s when the code value of the counting code C_code<0:2> which is increased from (0,0,0) after the select signal S_s is enabled becomes the same as the code value (1,0,0) of the select code S_code<0:2>. The counting unit 310 increases the code value of the counting code C_code<0:2> each time the clock CLK transitions to the high level. Therefore, the counting code C_code<0:2> which has the code value of (0,0,0) has the code value of (0,0,1) when the clock CLK first becomes the high level after the select signal S_s is enabled, has the code value of (0,1,0) when the clock CLK second becomes the high level, has the code value of (0,1,1) when the clock CLK third becomes the high level, and has the code value of (1,0,0) when the clock CLK fourth becomes the high level. If the code value of the counting code C_code<0:2> becomes (1,0,0), the enable signal EN_s is enabled.

Thus, the enable signal generation block 300 enables the enable signal EN_s, for example, when 4 cycles of the clock CLK pass after the select signal S_s is enabled.

The operation signal output selection block 400 outputs the enable signal EN_s as the fourth operation signal D_op since the operation select signal OP_s is in the disabled state.

In the semiconductor apparatus in accordance with an embodiment, in the examples where the code value of the second target code T_code2<0:2> is (1,0,0) and the operation select signal OP_s is disabled, the fourth operation signal D_op is enabled when, for example, 4 cycles of the clock CLK pass or occur after the second operation signal B_op is enabled.

As a result, in the semiconductor apparatus in accordance with an embodiment, when it is assumed that, for example, the first and second target codes T_code1<0:2> and T_code2<0:2> are (0,1,0) and (1,0,0), the third operation signal C_op is enabled when 2 cycles of the clock CLK pass after the first operation signal A_op is enabled, and the fourth operation signal D_op is enabled when 4 cycles of the clock CLK pass after the second operation signal B_op is enabled.

The code values of the first and second target codes T_code1<0:2> and T_code2<0:2> may be set differently. Although 3-bit target codes were explained, it is to be noted that the embodiment is not limited to such and more or less bits may be implemented.

In the semiconductor apparatus in accordance with an embodiment, a plurality of target codes may be respectively set, and accordingly, a plurality of operation signals may be added. Such a design change falls under a technology that may be easily worked by a person skilled in the art.

In the examples where the semiconductor apparatus in accordance with the embodiments are applied to memory, it may be assumed, for example, that a precharge operation should be performed when a first preset time passes after an active operation and the active operation should be performed when a second preset time passes after the precharge operation. In these cases, since the active operation and the precharge operation are not simultaneously performed, the operation select signal OP_s may be used as a signal which is enabled in the active operation and is disabled in the precharge operation. Further, the first operation signal A_op may be used as a signal which is enabled in the active operation, the second operation signal B_op may be used as a signal which is enabled in the precharge operation, the third operation signal C_op may be used as a signal which commands the precharge operation, and the fourth operation signal D_op may be used as a signal which commands the active operation.

As a result, the semiconductor apparatus in accordance with the embodiments, which are applied to such memory, may perform the precharge operation when a first preset number of cycles of a clock pass after the active operation and may perform the active operation when a second preset number of cycles of the clock pass after the precharge operation.

Moreover, the semiconductor apparatus in accordance with an embodiment may cause a second circuit to operate, when the first preset number of cycles of the clock pass after a first circuit operates, and may cause a fourth circuit to operate, when the second preset number of cycles of the clock pass after a third circuit operates.

As is apparent from the above descriptions, in the semiconductor apparatus in accordance with the embodiments, preset target times according to different objects may be measured using one counter circuit such that next operations may be performed after the preset target times pass.

The semiconductor apparatuses discussed above (see FIGS. 1-6) are particular useful in the design of memory devices, processors, and computer systems. For example, referring to FIG. 7, a block diagram of a system employing the semiconductor apparatuses in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 7:
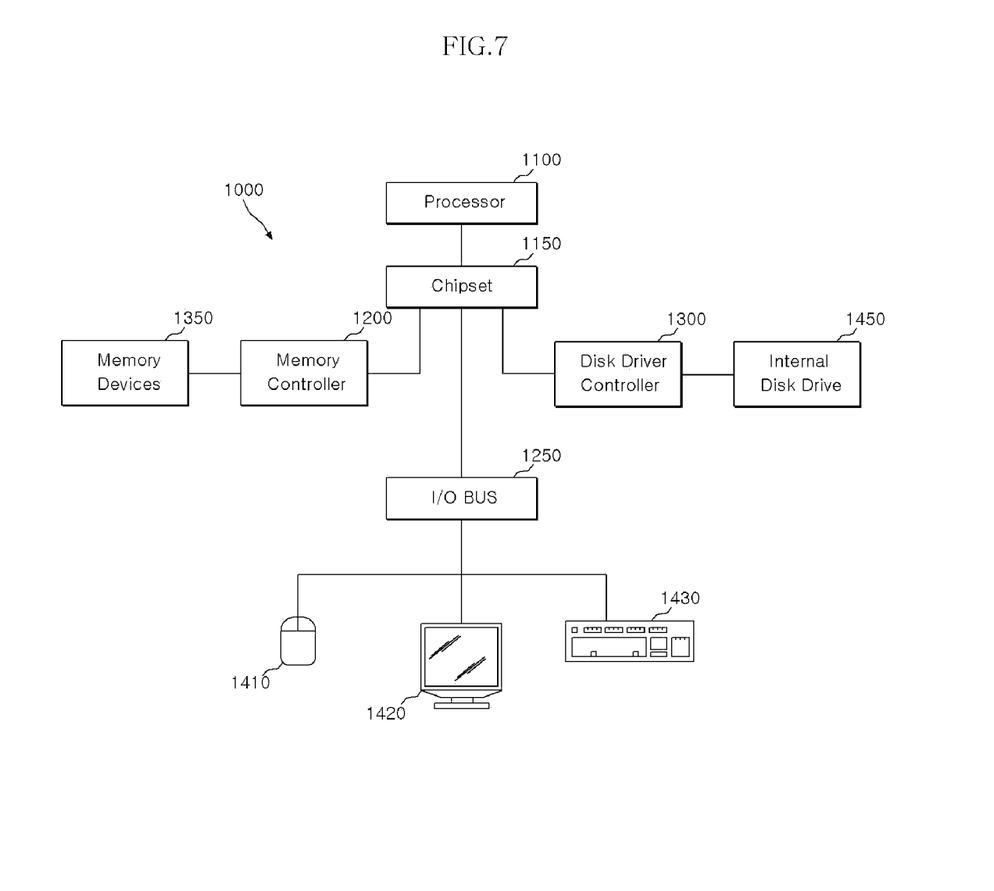
FIG. 7 illustrates a block diagram of an example of a representation of a system employing the semiconductor apparatus in accordance with the embodiments discussed above with relation to FIGS. 1-6.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor apparatus as discussed above with relation to FIGS. 1-6. In alternate embodiments, such as cellular phones or digital cameras, the components may differ from the embodiments illustrated in FIG. 7.

While various embodiments have been described above, it will be understood to those skilled in the art that the embodiments described are by way of example only. Accordingly, the semiconductor apparatus described herein should not be limited based on the described embodiments.

What is claimed is:

1. A semiconductor apparatus comprising:
an operation signal input selection block configured to output one of either a first operation signal or a second operation signal, as a select signal, in response to an operation select signal;
a target code selection block configured to output one of either a first target code or a second target code, as a select code, in response to the operation select signal;
an enable signal generation block configured to generate an enable signal when a time corresponding to the select code passes, in response to the select signal; and
an operation signal output selection block configured to output the enable signal, as one of either a third operation signal or a fourth operation signal, in response to the operation select signal.

2. The semiconductor apparatus according to claim 1, wherein the operation signal input selection block outputs the first operation signal as the select signal when the operation select signal is enabled, and outputs the second operation signal as the select signal when the operation select signal is disabled.

3. The semiconductor apparatus according to claim 2, wherein the operation signal input selection block includes:
a first logic gate configured for receiving the first operation signal and the operation select signal;
a first inverter configured for receiving the operation select signal;
a second logic gate configured for receiving an output of the first inverter and the second operation signal; and
a third logic gate configured for receiving an output of the first logic gate, receiving an output of the second logic gate, and outputting the select signal.

4. The semiconductor apparatus according to claim 1, wherein the target code selection block outputs the first target code as the select code when the operation select signal is enabled, and outputs the second target code as the select code when the operation select signal is disabled.

5. The semiconductor apparatus according to claim 4, wherein the target code selection block comprises a plurality of bit selection units configured to select and output respective bits of the first target code and the second target code in response to the operation select signal.

6. The semiconductor apparatus according to claim 5, wherein the plurality of bit selection units include:
a first logic gate configured for receiving a bit of the first target code and the operation select signal;
a first inverter configured for receiving the operation select signal;
a second logic gate configured for receiving an output of the first inverter and a bit of the second target code; and
a third logic gate configured for receiving an output of the first logic gate, receiving an output of the second logic gate, and outputting a bit of the select code.

7. The semiconductor apparatus according to claim 1, wherein the enable signal generation block enables the enable signal when a preset number of cycles of a clock corresponding to the select code occur, in response to the select signal.

8. The semiconductor apparatus according to claim 7, wherein the enable signal generation block comprises:
a counting unit configured to generate a counting code in response to the select signal; and
a comparison unit configured to compare the select code and the counting code, and generate the enable signal.

9. The semiconductor apparatus according to claim 8, wherein the counting unit initializes the counting code when the select signal is disabled, and increases a code value of the counting code each time the clock transitions to a specified level, when the select signal is enabled.

10. The semiconductor apparatus according to claim 8, wherein the comparison unit enables the enable signal when a code value of the counting code and a code value of the select code are the same.

11. The semiconductor apparatus according to claim 10, wherein the comparison unit includes:
a first logic gate configured for receiving a first bit of the counting code and a first bit of the select code;
a second logic gate configured for receiving a second bit of the counting code and a second bit of the select code;
a third logic gate configured for receiving a third bit of the counting code and a third bit of the select code;
a fourth logic gate configured for receiving the outputs of the first, second, and third logic gates;
an inverter configured for receiving an output of the fourth logic gate and outputting the enable signal.

12. The semiconductor apparatus according to claim 1, wherein the operation signal output selection block outputs the enable signal as the third operation signal when the operation select signal is enabled, and outputs the enable signal as the fourth operation signal when the operation select signal is disabled.

13. The semiconductor apparatus according to claim 12, wherein the operation signal output selection block includes:
a first logic gate configured for receiving the enable signal and the operation select signal;
a first inverter configured for receiving the operation select signal;
a second logic gate configured for receiving an output of the first inverter and the enable signal;
a second inverter configured for receiving the output of the first logic gate and outputting the third operational signal; and
a third inverter configured for receiving the output of the second logic gate and outputting the fourth operational signal.

14. A semiconductor apparatus comprising:
an enable signal generation block configured to enable an enable signal when a preset time passes after a select signal is enabled; and
a target code selection block configured to select one code among target codes in response to an operation select signal, determine the preset time corresponding to selected one code, and transfer the preset time to the enable signal generation block.

15. The semiconductor apparatus according to claim 14, wherein the enable signal generation block enables the enable signal when a preset number of cycles of a clock pass after the select signal is enabled.

16. The semiconductor apparatus according to claim 15,
wherein the target codes includes a first target code and a second target code,
wherein the target code selection block transfers the first target code for a first preset number of cycles of the clock or the second target code for a second preset number of cycles of the clock, in response to the operation select signal.

17. The semiconductor apparatus according to claim 16, wherein the enable signal generation block comprises:
a counting unit configured to generate a counting code when the select signal is enabled; and a comparison unit configured to enable the enable signal when the counting code and a target code received from the target code selection block are the same.

* * * * *